(12) United States Patent  
Kao (10) Patent No.: US 7,899,961 B2  
(45) Date of Patent: Mar. 1, 2011

(54) MULTI-MODE BUS INVERSION METHOD AND APPARATUS

(75) Inventor: Rom-Shen Kao, Durham, NC (US)

(73) Assignee: Qimonda AG, München (DE)

( * ) Notice: Subject to any disclaimer, the term of this patent is extended or adjusted under 35 U.S.C. 154(b) by 51 days.

(21) Appl. No.: 12/202,485

(22) Filed: Sep. 2, 2008

(65) Prior Publication Data

US 2010/0057971 A1    Mar. 4, 2010

(51) Int. Cl.
*G06F 13/00* (2006.01)

(52) U.S. Cl. .......................................... 710/100; 341/58

(58) Field of Classification Search ................. 710/100; 711/1, 100, 154, 167, 170; 341/58
See application file for complete search history.

(56) References Cited

U.S. PATENT DOCUMENTS

| 6,584,526 | B1 | 6/2003 | Bogin et al. |
| 6,898,648 | B2 | 5/2005 | LaBerge |
| 7,139,852 | B2 | 11/2006 | LaBerge |
| 7,280,412 | B2 | 10/2007 | Jang et al. |
| 7,522,073 | B1 * | 4/2009 | Kao ............................ 341/55 |
| 7,616,133 | B2 * | 11/2009 | Hollis .......................... 341/58 |
| 2002/0156953 | A1 * | 10/2002 | Beiley et al. ................. 710/105 |
| 2004/0068594 | A1 * | 4/2004 | Asaro et al. .................. 710/104 |
| 2005/0132112 | A1 * | 6/2005 | Pawlowski ................... 710/110 |
| 2007/0011379 | A1 * | 1/2007 | Pawlowski ................... 710/110 |
| 2007/0038789 | A1 * | 2/2007 | Macri et al. .................. 710/105 |
| 2007/0115733 | A1 | 5/2007 | Jang et al. |
| 2007/0121360 | A1 | 5/2007 | Lee |
| 2007/0242508 | A1 | 10/2007 | Bae |
| 2007/0282932 | A1 * | 12/2007 | Rhim et al. .................. 708/200 |
| 2008/0019451 | A1 * | 1/2008 | Jang et al. .................... 375/259 |
| 2009/0116330 | A1 * | 5/2009 | Yang ...................... 365/230.08 |
| 2009/0179782 | A1 * | 7/2009 | Hollis .......................... 341/55 |

* cited by examiner

*Primary Examiner*—Glenn A Auve
(74) *Attorney, Agent, or Firm*—Coats & Bennett, P.L.L.C.

(57) ABSTRACT

In one embodiment, an integrated circuit comprises circuitry for performing bus inversion. The circuitry is operable to configure the integrated circuit to implement one of a plurality of bus inversion schemes each of which the integrated circuit is capable of performing. The circuitry is also operable to process data input to and output from the integrated circuit based on the bus inversion scheme for which the integrated circuit is configured.

17 Claims, 7 Drawing Sheets

MULTI-MODE BUS INVERSION METHOD AND APPARATUS

BACKGROUND OF THE INVENTION

Integrated circuits such as microprocessors, digital signal processors, memory devices, application-specific integrated circuits (ASICs) and the like typically have one or more buses for carrying data, address and/or control information. Driver circuitry is used to drive the information off-chip on the buses. The driver circuitry is typically inverter-type, i.e., when a bit is a logic one, there is no current path, and when a bit is a logic zero, there is a current path through the transmission medium. As such, current consumed by the driver circuitry varies over time as a function of bus voltage level, causing interference.

Data Bus Inversion for DC (DBIdc) is one conventional approach for reducing static or quiescent current draw by data bus driver circuitry. DBIdc involves counting the number of ones and zeros in a data word. If the number of zeros exceeds a predetermined count value, the data word is inverted and a flag is set to indicate the data word has been inverted. Otherwise, the data word is not inverted and the flag is not set. This way, fewer logic zeroes are transmitted and power consumption is correspondingly reduced. The entity that receives the data word interrogates the flag to determine whether the data word has been inverted. The receiver inverts each bit of the data word if the flag is set, else the word is taken as-is.

However, not all DBIdc schemes are the same. Take, for example, memory devices. Different DBIdc schemes are specified across various memory standards. For example, the GDDR4 (Graphics Double Data Rate, version 4) graphics memory standard employs a DBIdc scheme having a predetermined count value of four in a byte-wise DBIdc scheme (i.e., data words are 8 bits in length). A DBIdc flag is set to a logic high state when the number of zeros in a data word exceeds four, indicating bus inversion has occurred. According to the LPDDR2 (Low Power DDR2) DBIdc scheme, the predetermined count value is three and the flag is also set to a logic high state for indicating data bus inversion. The GDDR5 (Graphics Double Data Rate, version 5) DBIdc scheme uses a count value of four as in GDDR4, but the flag is set to a logic low state for indicating data bus inversion. Memory devices are conventionally designed to accommodate the DBIdc scheme associated with a singular application, e.g., GDDR4, GDDR5, LPDDR2, etc. This limits memory device use to a particular application or requires re-design or other alteration each time the device is used in a different application.

SUMMARY OF THE INVENTION

In one embodiment, an integrated circuit comprises circuitry for performing bus inversion. The circuitry is operable to configure the integrated circuit to implement one of a plurality of bus inversion schemes each of which the integrated circuit is capable of performing. The circuitry is also operable to process data input to and output from the integrated circuit based on the bus inversion scheme for which the integrated circuit is configured.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
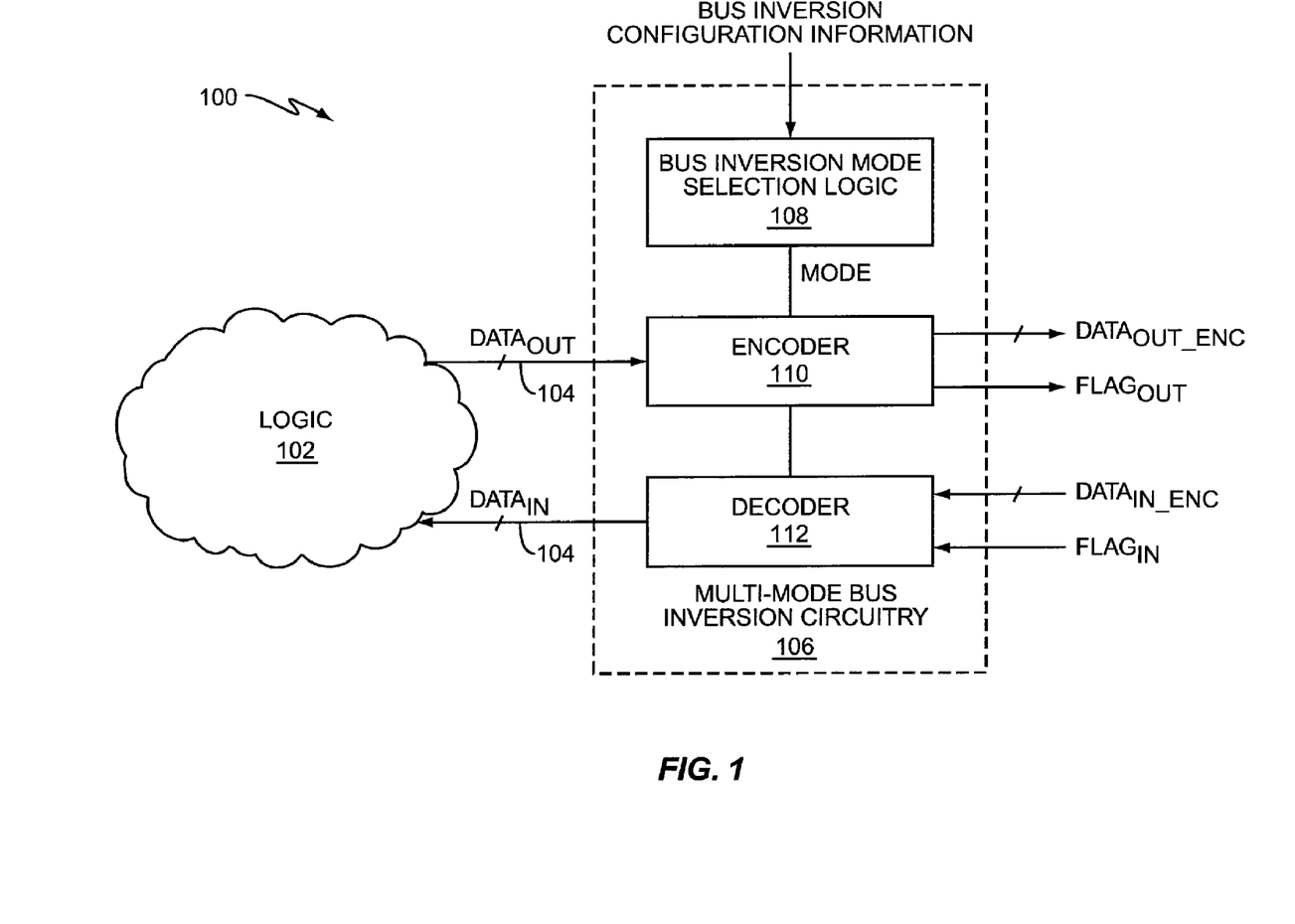
FIG. 1 is a block diagram of an embodiment of an integrated circuit including multi-mode bus inversion circuitry.

FIG. 1 illustrates an embodiment of an integrated circuit (IC) 100 such as a microprocessor, digital signal processor, memory device, ASIC or the like. Logic 102 included in the IC 100 performs various functions for which the IC 100 is designed. Accordingly, the logic 102 may include analog, digital and/or mixed signal logic, registers, memory arrays, fuses, arithmetic logic units, floating point units, integer units, etc. or any combination thereof. One or more buses 104 included in the IC 100 carry words of information to ($DATA_{IN}$) and from ($DATA_{OUT}$) the logic 102. The term "word" as used herein means any unit of information such as data, address and/or control information used by the IC 100. The number of bits in a word (the word size or word length) depends on the structure and operation of the IC 100. Many processor-based ICs typically have a word size of 32, 64 or 128 bits while memory-based ICs typically have a word size of 4, 8 or 16 bits. However, other sizes are also common, including 8, 9, 12, 18, 24, 36, 39, 40, 48, and 60 bits. Accordingly, the IC 100 can process words having any number of bits.

Figure 2:
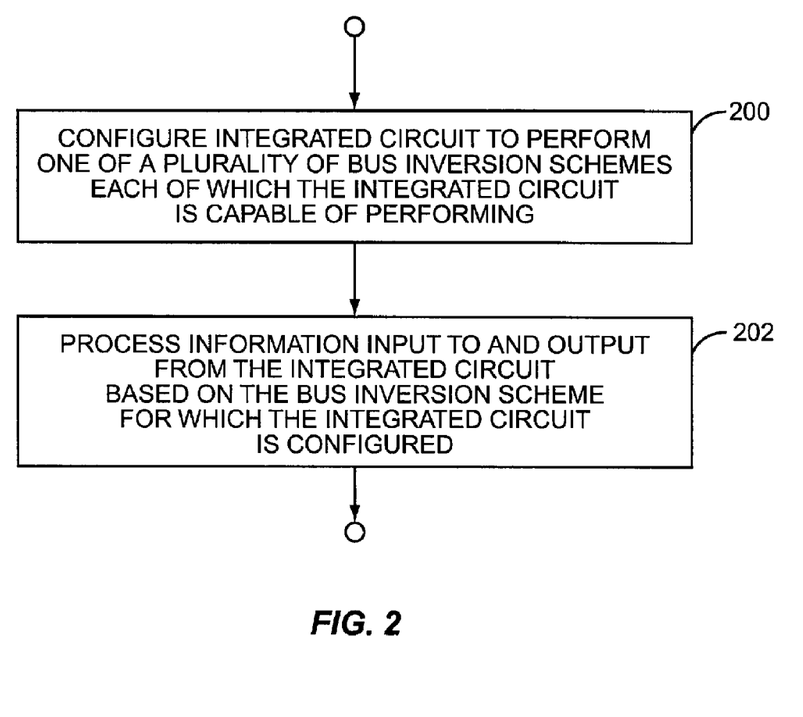
FIG. 2 is a logic flow diagram of an embodiment of program logic for performing bus inversion.

The IC 100 also has multi-mode bus inversion circuitry 106 for configuring the IC 100 to implement one of a plurality of bus inversion schemes each of which the IC 100 is capable of performing, e.g., as illustrated by Step 200 of FIG. 2. This way, the IC 100 can readily support different applications having disparate bus inversion schemes without re-design or other alteration. The bus inversion circuitry 106 includes mode selection logic 108 for determining which one of the supported bus inversion schemes should be implemented during IC operation. This determination is made based on bus inversion configuration information provided to the mode selection logic 108. In one embodiment, the configuration information is hard-wired in that it can be stored in fuses (not shown) included in the IC 100, or provided to the IC 100 via bonding wires, pins or other external hard-wired connections (also not shown). In another embodiment, the configuration information is programmable via software such as by the mode select feature available to many memory devices. This way, the IC 100 can be re-configured to implement different ones of the bus inversion schemes.

Either way, the mode selection logic 108 processes the configuration information to determine which one of the supported bus inversion schemes should be implemented by the IC 100. The multi-mode bus inversion circuitry 106 processes data input to and output from the IC 100 based on the bus inversion scheme selected by the mode selection logic 108, e.g., as illustrated by Step 202 of FIG. 2. To this end, the bus inversion circuitry 106 includes encoder and decoder logic 110, 112. The mode selection logic 108 indicates to the encoder and decoder logic 110, 112 which bus inversion scheme has been selected, e.g., via a MODE indicator output by the mode selection logic 108 as shown in FIG. 1. The encoder logic 110 processes information output from the IC logic 102 based on the selected bus inversion scheme. The decoder logic 112 similarly processes information input to the IC 100 according to the present bus inversion scheme.

In more detail, the encoder logic 110 inverts each word of information ($DATA_{OUT}$) output by the IC logic 102 having a total number of zero bits exceeding a count value associated with the selected bus inversion scheme. In one embodiment, the count value is four for an 8-bit bus. In another embodiment, the count value is three for an 8-bit bus. Those skilled in the art will readily recognize that any count value may be used by the encoder logic 110 for determining when to perform bus inversion. The encoder logic 110 also sets an output flag ($FLAG_{OUT}$) in accordance with the selected bus inversion scheme to indicate when the IC 100 outputs an information word ($DATA_{OUT\_ENC}$) which has been inverted. In one embodiment, the output flag is set when driven to a logic one state. In another embodiment, a logic low state indicates data inversion has been performed. Those skilled in the art will readily recognize that the encoder logic 110 may indicate bus inversion in various other ways.

Figure 3:
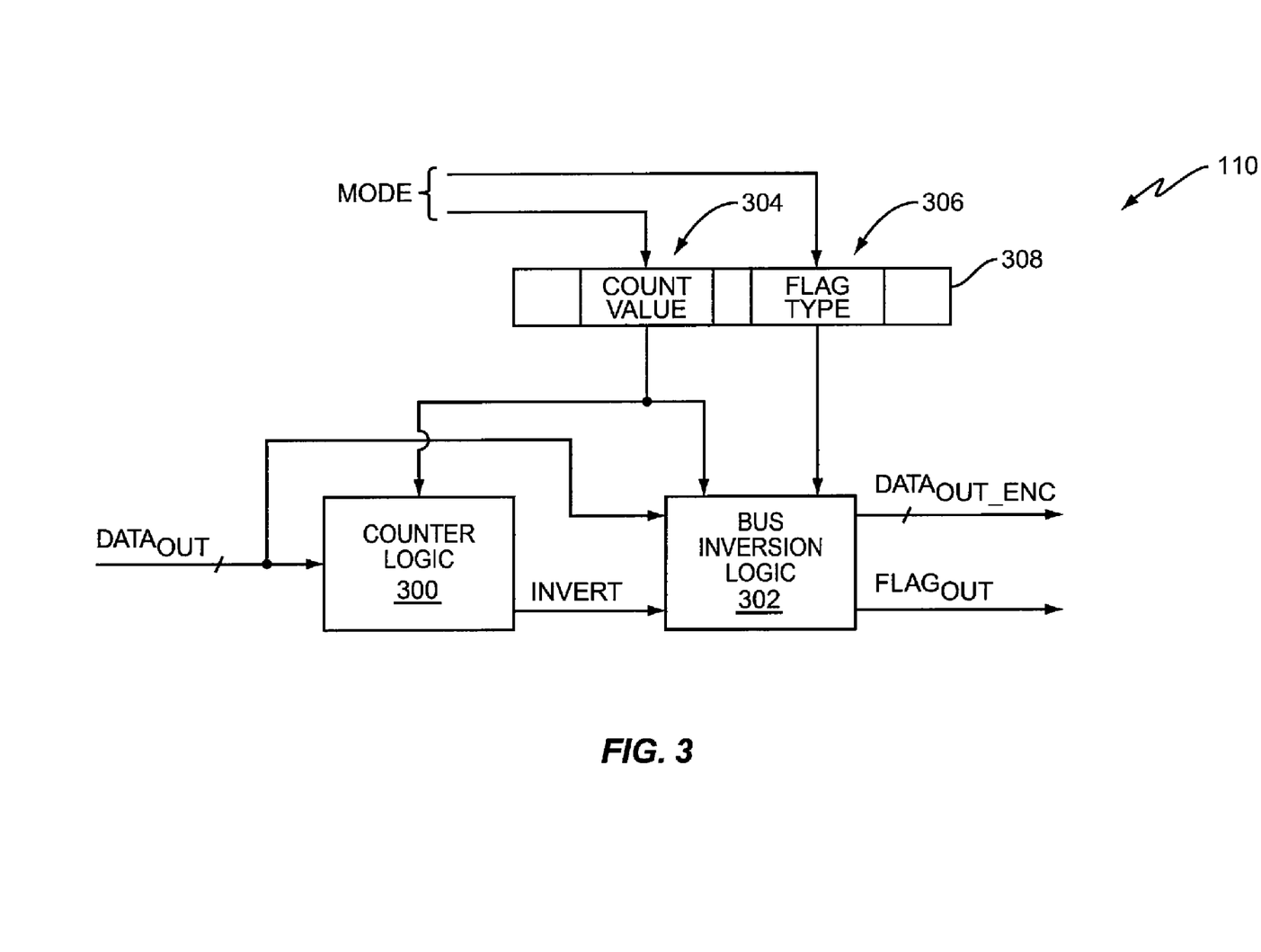
FIG. 3 is a block diagram of an embodiment of encoder logic included in or associated with the multi-mode bus inversion circuitry of FIG. 1.

FIG. 3 illustrates an embodiment of the encoder logic 110 included in or associated with the multi-mode bus inversion circuitry 106. According to this embodiment, the encoder logic 110 includes counter logic 300 and bus inversion logic 302. The counter logic 300 determines when an information word ($DATA_{OUT}$) output by the IC logic 102 should be inverted based on the bus inversion scheme selected by the mode selection logic 108. In one embodiment, the MODE indicator output by the mode selection logic includes a count value parameter 304 and a flag type parameter 306. The count value 304 indicates how many zeros should be in a word of information to warrant inversion. The flag type 306 determines how the IC 100 indicates when bus inversion has occurred, e.g., a logic high or logic zero indicator. In one embodiment, one or more register bits or latches 308 included in or associated with the multi-mode bus inversion circuitry 106 are set to indicate which one of the bus inversion schemes has been selected. In one embodiment, the register bits/latches 308 are set to indicate the count value and flag type associated with the bus inversion scheme currently implemented by the IC 100. The register/latch state can be changed to indicate a newly selected bus inversion scheme. In another embodiment, a lookup table (not shown) is used to identify the count value and flag type associated with the selected bus inversion scheme.

Regardless, the counter logic 300 uses the count value 304 to determine when information words ($DATA_{OUT}$) output from the IC logic 102 should be inverted. In one embodiment, the counter logic 300 is a programmable counter initialized with the current count value 304. In another embodiment, the counter logic 300 includes multiple counters each initialized to a different one of the count values 304 associated with the bus inversion schemes supported by the IC 100. Regardless, the counter logic 300 examines information words to determine whether the total number of zero bits included in each word exceeds the current count value 304. The output (INVERT) of the counter logic 300 is activated each time the count value 304 is exceeded and the bus inversion logic 302 inverts the corresponding word. The bus inversion logic 302 also sets the output flag ($FLAG_{OUT}$) in accordance with the current flag type parameter 306 for indicating that a word output by the IC 100 has been inverted. This way, an entity that receives the word is aware that it has been inverted. The bus inversion logic 302 does not invert information words nor does it set the output flag when the output of the counter logic 300 is not activated.

Figure 4:
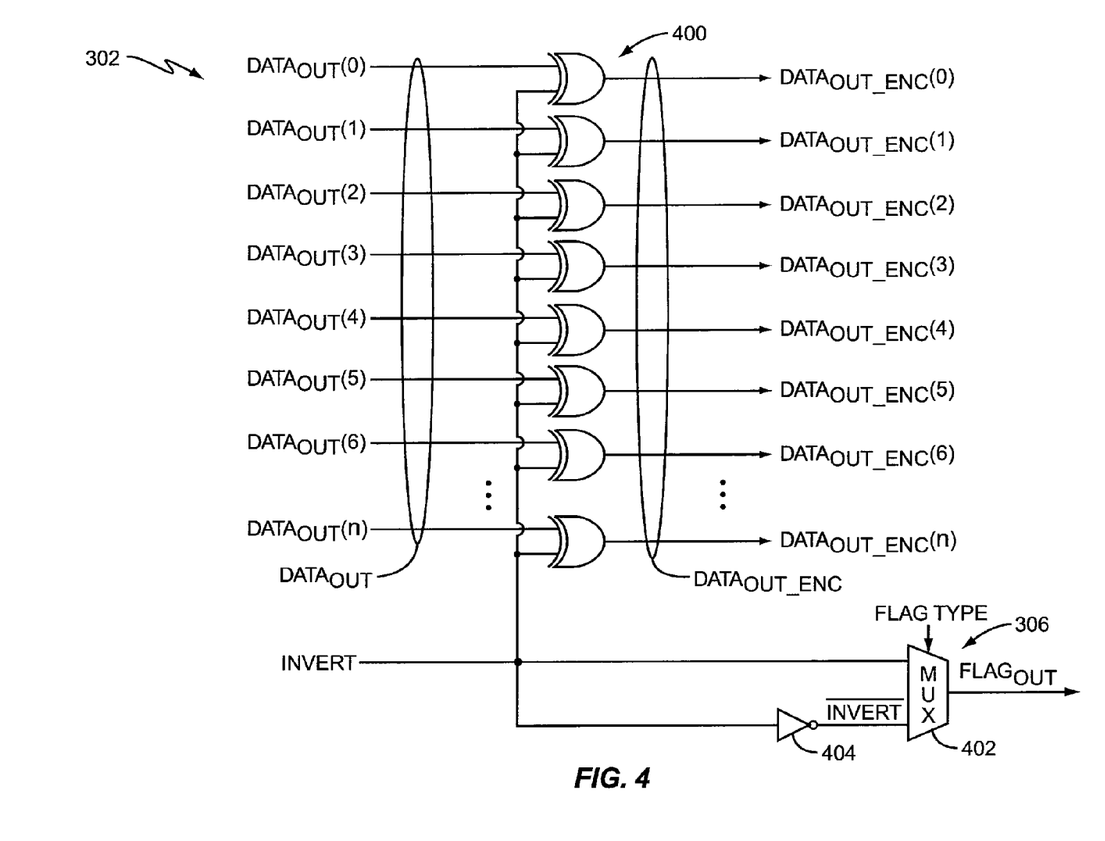
FIG. 4 is a block diagram of an embodiment of bus inversion logic included in or associated with the encoder logic of FIG. 3.

FIG. 4 illustrates an embodiment of the bus inversion logic 302. Each bit ($DATA_{OUT}$<0:n>) of an information word output by the IC logic 102 is input to a respective exclusive-OR (XOR) logic gate 400. The other input of each XOR logic gate 400 is coupled to the output (INVERT) of the counter logic 300. This way, when the counter logic output is activated at a logic high state to indicate the current count value has been exceeded, each bit of the corresponding word is inverted by the respective XOR logic gates 400 to form the information word ($DATA_{OUT\_ENC}$) output by the IC 100.

The bus inversion logic 302 also sets the output flag ($FLAG_{OUT}$) in accordance with the current flag type parameter 306 to indicate that the current word has been inverted. In one embodiment, the counter logic output (INVERT) is coupled to one input of a multiplexer 402. The counter output is also provided to an inverter 404, the output of which is coupled to another input of the multiplexer 402. The current flag type parameter 306 determines which multiplexer input is selected for the flag output. If the current flag type 306 has a logic high polarity for indicating data inversion, the un-inverted counter logic output (INVERT) is selected as the flag output because it is driven to a logic high state when bus inversion occurs. Conversely, the inverted counter logic output ($\overline{INVERT}$) is selected when the current flag type 306 has a logic low polarity for indicating data inversion because the output of the inverter 404 is at a logic low state when bus inversion occurs.

Regardless, the bus inversion logic 302 inverts outgoing information when the counter logic 300 determines that the current count value 306 has been exceeded and sets the output flag to indicate bus inversion has occurred. On the other hand, the XOR logic gates 400 of the bus inversion logic 302 pass the outgoing information un-inverted when the counter logic output is not activated. This way, the IC 100 can readily accommodate any desired bus inversion scheme for outputting information. The multi-mode bus inversion circuitry 106 ensures that the same holds true on the input-side of the IC 100 so that the IC 100 is fully compatible with multiple bus inversion schemes. To this end, the decoder logic 112 included in or associated with the multi-mode bus inversion circuitry 106 is similarly made aware of the selected bus inversion scheme and processes information input to the IC 100 according to the selected scheme.

Figure 5:
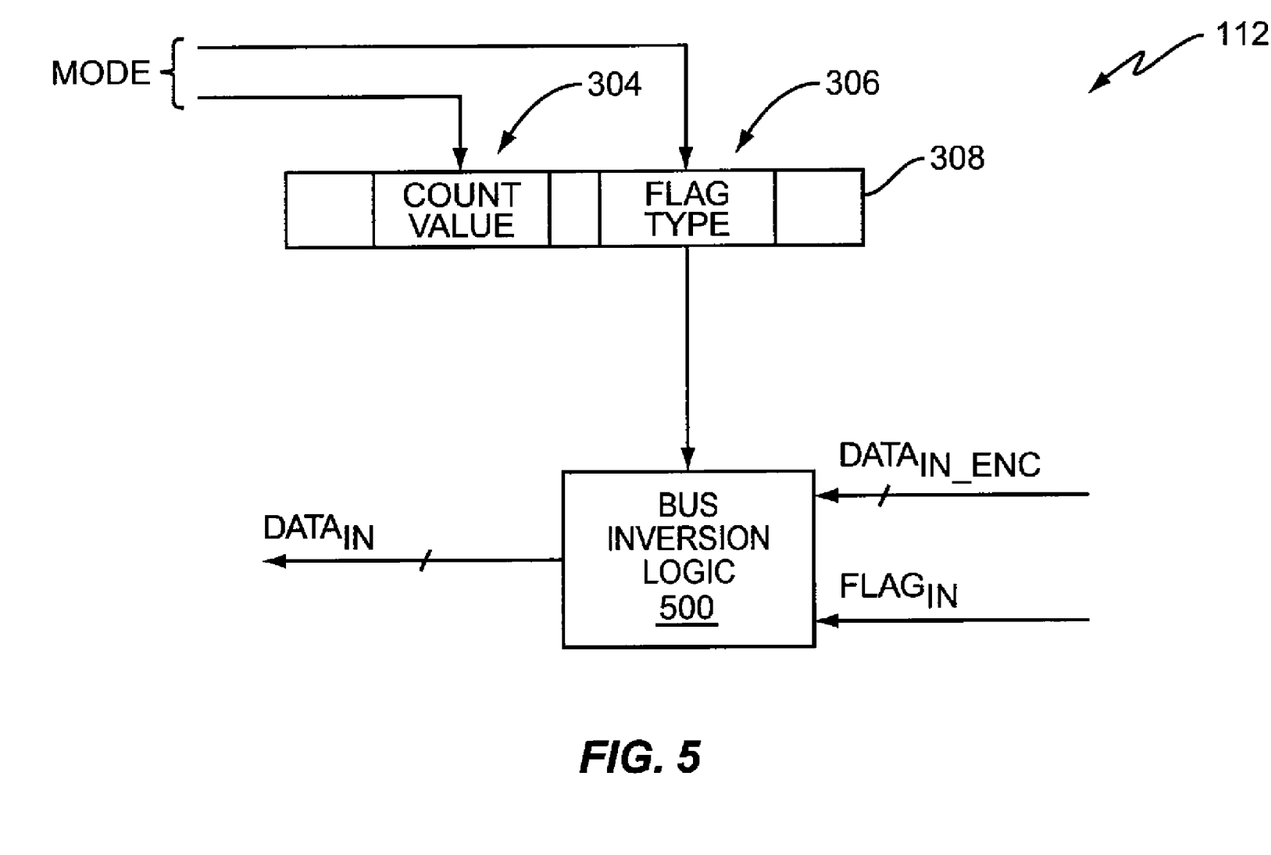
FIG. 5 is a block diagram of an embodiment of decoder logic included in or associated with the multi-mode bus inversion circuitry of FIG. 1.

FIG. 5 illustrates an embodiment of the decoder logic 112. According to this embodiment, the decoder logic 112 includes bus inversion logic 500. The bus inversion logic 500 compares a bus inversion flag ($FLAG_{IN}$) input to the IC 100 with the current flag type 306 to determine whether an information word ($DATA_{IN\_ENC}$) input to the IC 100 has been inverted. If the flag is set, the bus inversion logic 500 inverts the word and passes it to the IC logic 102 for processing ($DATA_{IN}$). Otherwise, the received word is passed un-inverted to the IC logic 102.

Figure 6:
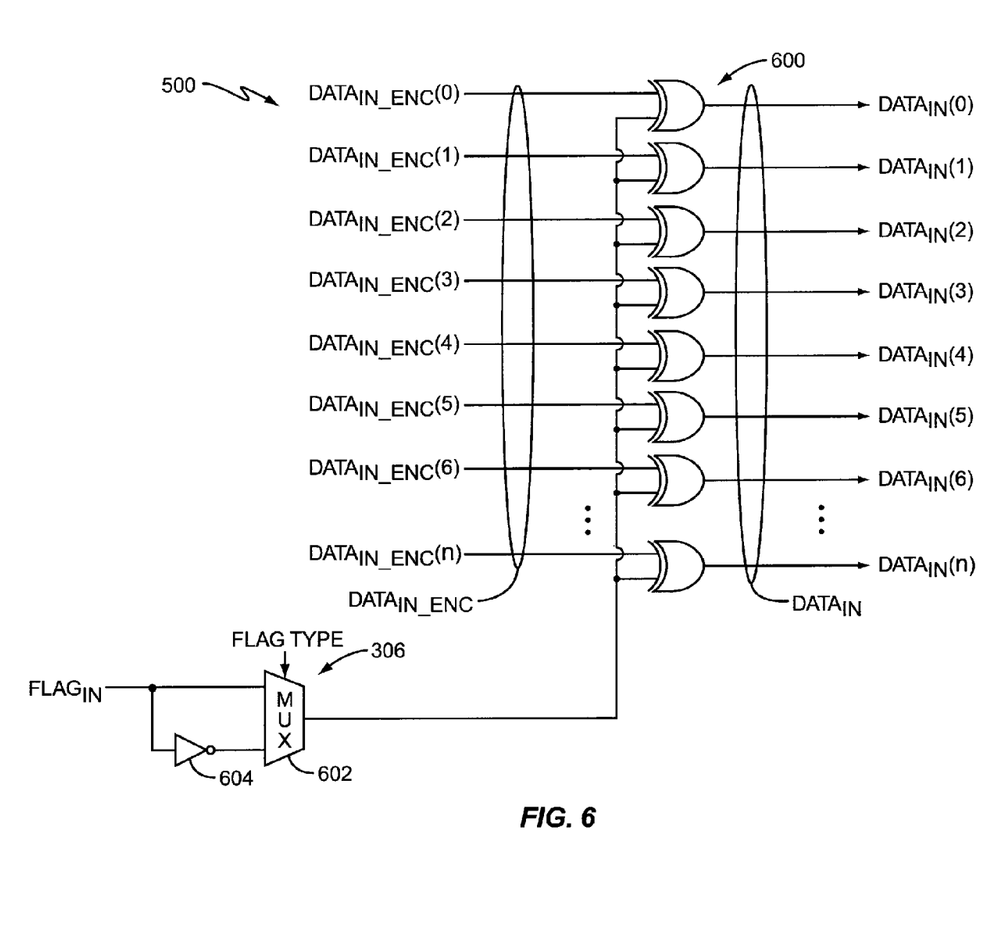
FIG. 6 is a block diagram of an embodiment of bus inversion logic included in or associated with the decoder logic of FIG. 5.

FIG. 6 illustrates an embodiment of the bus inversion logic 500 included in or associated with the decoder logic 112. Each bit ($DATA_{IN\_ENC}$<0:n>) of an information word received by the IC 100 is input to a respective XOR logic gate 600. The other input of each XOR logic gate 600 is coupled to the output of a multiplexer 602. The multiplexer 602 has two inputs. One input is the flag input received by the IC 100. The flag input is also provided to an inverter 604, the output of which serves as the other multiplexer input. The current flag type 306 controls the multiplexer 602. If the current flag type 306 has a logic high polarity for indicating bus inversion, the multiplexer 602 selects the un-inverted flag input (FLAG$_{IN}$). Otherwise, the inverted flag input is selected. This way, each bit (DATA$_{IN\_ENC}$<0:n>) of a received word is inverted by the respective XOR logic gates 600 when the input flag is set regardless of its polarity, i.e., regardless of whether the flag is set to a logic high or low state to indicate bus inversion has occurred. Thus, the multi-mode bus inversion circuitry 106 ensures that the IC 100 is readily compatible with a plurality of bus inversion schemes used to process information input to and output from the IC 100.

Figure 7:
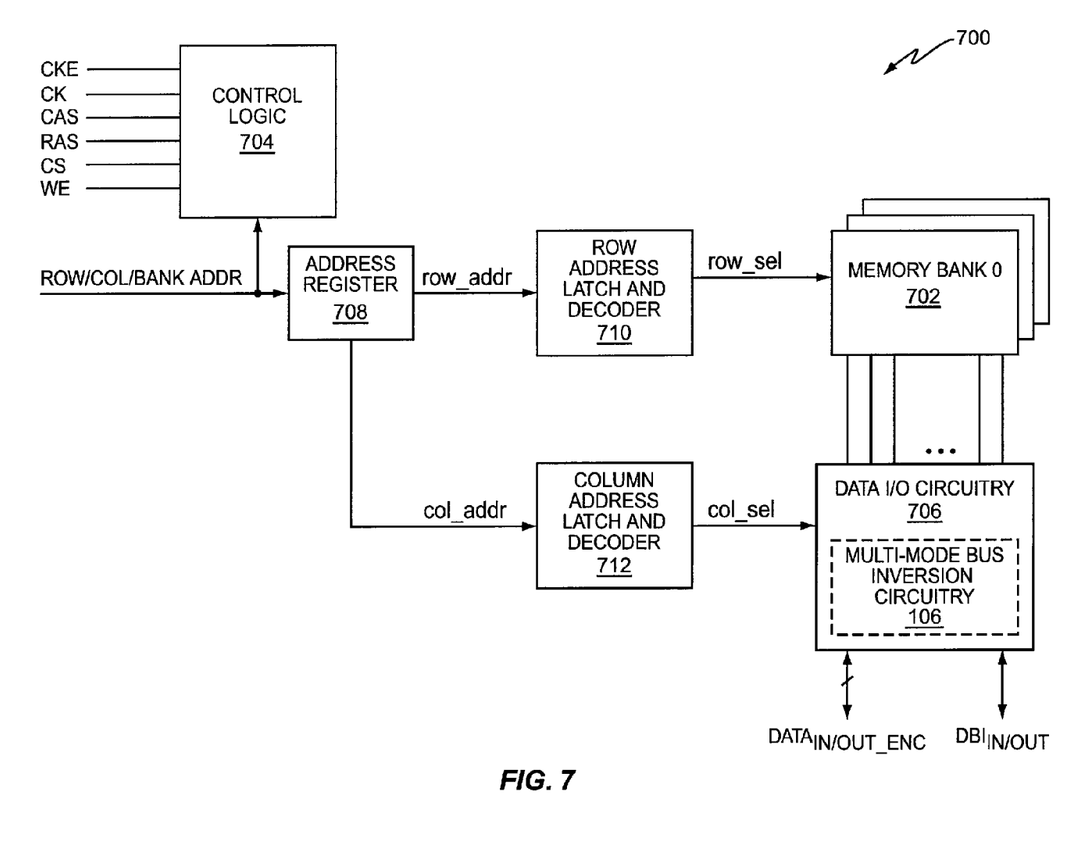
FIG. 7 is a block diagram of an embodiment of a memory device including multi-mode bus inversion circuitry.

FIG. 7 illustrates a memory device embodiment of the IC 100. According to this embodiment, a memory device 700 includes one or more banks of memory arrays 702 for storing data. Each memory array bank 702 includes a plurality of memory cells (not shown) having a storage element located at the intersection of a word line (i.e., row) and bit line (i.e., column). Control logic 704 included in the memory device 700 receives input control signals such as chip select (CS), row address strobe (RAS), column address strobe (CAS), clock enable (CKE) and write enable (WE) signals in synchronization with a system clock (CK).

The control logic 704 decodes the input control signals into one or more commands. Each decoded command instructs the memory device 700 to perform a particular operation. In response to a decoded command, the control logic 704 enables, disables, or otherwise controls various functions of the memory device 700 in order to execute particular commands. Data input/output (I/O) circuitry 706 samples, or captures, input data signals during write operations and drives output data signals during read operations. An address register 708 stores a row, column and bank address (ROW/COL/BANK ADDR) associated with a particular array location at which data is to be read from or written to during a normal memory operation, i.e., a non-refresh operation.

The row and column addresses are provided to row and column latch and decoder circuits 710, 712, respectively. Particularly, the address register 708 provides a row address (row_addr) to the row address latch and decoder circuit 710 for activating a corresponding word line (row_sel) in the memory array 702. The address register 708 also provides a column address (col_addr) to the column address latch and decoder circuit 712 for activating a corresponding bit line (col_sel) in the memory array 702. As such, a specific word and bit line of the memory array 702 can be selected, or activated, in response to an address associated with a particular command.

The data I/O circuitry 706 provides a data read/write gating mechanism by which data is either read from or written to the selected memory array location. This includes a plurality of sense amplifiers (not shown) and I/O gating circuits such as read latches and write drivers (not shown). The sense amplifiers and I/O gating circuits can be arranged in any suitable configuration such as local, sub-array, global or other shared or unshared configurations. The read latches provide data sampled by the sense amplifiers to the data I/O circuitry 706 for external transmission during a read operation. The write drivers provide data to the memory array 702 for storing the data during a write operation. The data I/O circuitry 706 enables specific I/O gating circuits associated with targeted memory cells during a particular operation.

The multi-mode bus inversion circuitry 106 is included in or associated with the data I/O circuitry 706 to enable data bus inversion. The memory device 700 obtains data bus inversion configuration information indicating one of a plurality of data bus inversion schemes each of which the memory device 700 is capable of performing. The multi-mode bus inversion circuitry 106 configures the memory device 700 to implement the data bus inversion scheme indicated by the configuration information and processes data written to and read from the memory device 700 based on the data bus inversion scheme for which the memory device 700 is configured as generally described above. This way, any one of a plurality of data bus inversion schemes supported by the memory device 700 can be selected for implementation by the memory device 700. In one embodiment, the memory device 700 is capable of performing the data bus inversion schemes associated with at least the GDDR4, GDDR5 and/or LPDDR2 memory standards. The multi-mode bus inversion circuitry 106 generally permits the memory device 700 to be readily configured for different applications without requiring re-design or alteration.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of performing bus inversion by an integrated circuit, comprising:
    determining which of one of a plurality of bus inversion schemes supported by the integrated circuit should implement during operation of the integrated circuit;
    configuring the integrated circuit to implement the determined bus inversion scheme;
    storing a count value and a flag type associated with the bus inversion scheme for which the integrated circuit is configured, the count value indicating a number of bits of a data word that must be in a certain logic state for the data word to be inverted, the flag type indicating whether a bit inversion flag for the data word should be set to a logic zero or a logic one to indicate if the data word is inverted, wherein the flag type for a first one of the plurality of bus inversion schemes indicates the bit inversion flag should be set to a logic zero if the data word is inverted and the flag type for a second one of the plurality of bus inversion schemes indicates the bit inversion flag should be set to a logic one if the data word is inverted so that the integrated circuit accommodates bus inversion schemes having different count values and different flag types; and
    processing information input to and output from the integrated circuit in accordance with the count value and the flag type associated with the bus inversion scheme for which the integrated circuit is configured.

2. The method of claim 1, wherein configuring the integrated circuit to implement one of the bus inversion schemes comprises configuring the integrated circuit to implement the bus inversion scheme corresponding to hard-wired bus inversion configuration information obtained by the integrated circuit.

3. The method of claim 1, wherein configuring the integrated circuit to implement one of the bus inversion schemes comprises configuring the integrated circuit to implement the bus inversion scheme corresponding to programmable bus inversion configuration information obtained by the integrated circuit.

4. The method of claim 1, wherein configuring the integrated circuit to implement one of the bus inversion schemes comprises setting one or more register bits or latches to indicate which one of the bus inversion schemes the integrated circuit is configured to implement.

5. The method of claim 1, wherein configuring the integrated circuit to implement one of the bus inversion schemes comprises:
 selecting one of a plurality of bit count values for use by the integrated circuit in determining when bus inversion is to be implemented; and
 selecting one of a plurality of flag types for use by the integrated circuit in indicating when bus inversion has been implemented, a first one of the plurality of flag types indicating the bit inversion flag should be set to a logic zero if the data word is inverted and a second one of the plurality of flag types indicating the bit inversion flag should be set to a logic one if the data word is inverted.

6. The method of claim 5, wherein processing information input to and output from the integrated circuit based on the bus inversion scheme for which the integrated circuit is configured comprises:
 inverting the data word responsive to the data word having a total number of logic zero bits exceeding the selected bit count value;
 setting the bit inversion flag in accordance with the selected flag type responsive to the word being inverted; and
 inverting a new data word input to the integrated circuit responsive to an input flag received by the integrated circuit being set in accordance with the selected flag type.

7. The method of claim 1, further comprising re-configuring the integrated circuit to implement a different one of the bus inversion schemes responsive to the integrated circuit being directed to change bus inversion schemes.

8. An integrated circuit, comprising circuitry operable to:
 determine which of one of a plurality of bus inversion schemes supported by the integrated circuit should implement during operation of the integrated circuit;
 configure the integrated circuit to implement the determined bus inversion scheme;
 store a count value and a flag type associated with the bus inversion scheme for which the integrated circuit is configured, the count value indicating a number of bits of a data word that must be in a certain logic state for the data word to be inverted, the flag type indicating whether a bit inversion flag for the data word should be set to a logic zero or a logic one to indicate if the data word is inverted, wherein the flag type for a first one of the plurality of bus inversion schemes indicates the bit inversion flag should be set to a logic zero to indicate the data word is inverted and the flag type for a second one of the plurality of bus inversion schemes indicates the bit inversion flag should be set to a logic one to indicate the data word is inverted so that the integrated circuit accommodates bus inversion schemes having different count values and different flag types; and
 process information input to and output from the integrated circuit in accordance with the count value and the flag type associated with the bus inversion scheme for which the integrated circuit is configured.

9. The integrated circuit of claim 8, wherein the circuitry is operable to implement the bus inversion scheme corresponding to hard-wired bus inversion configuration information obtained by the integrated circuit.

10. The integrated circuit of claim 8, wherein the circuitry is operable to implement the bus inversion scheme corresponding to programmable bus inversion configuration information obtained by the integrated circuit.

11. The integrated circuit of claim 8, wherein the circuitry comprises one or more register bits or latches operable to indicate which one of the bus inversion schemes the integrated circuit is configured to implement.

12. The integrated circuit of claim 8, wherein the circuitry is operable to:
 select one of a plurality of bit count values for use by the integrated circuit in determining when bus inversion is to be implemented; and
 select one of a plurality of flag types for use by the integrated circuit in indicating when bus inversion has been implemented, a first one of the plurality of flag types indicating the bit inversion flag should be set to a logic zero if the data word is inverted and a second one of the plurality of flag types indicating the bit inversion flag should be set to a logic one if the data word is inverted.

13. The integrated circuit of claim 12, wherein the circuitry is operable to:
 invert the data word responsive to the data word having a total number of logic zero bits exceeding the selected bit count value;
 set the bit inversion flag in accordance with the selected flag type responsive to the word being inverted; and
 invert a new data word input to the integrated circuit responsive to an input flag received by the integrated circuit being set in accordance with the selected flag type.

14. The integrated circuit of claim 8, wherein the circuitry is further operable to re-configure the integrated circuit to implement a different one of the bus inversion schemes responsive to the integrated circuit being directed to change bus inversion schemes.

15. An integrated circuit, comprising:
 logic operable to configure the integrated circuit to implement one of a plurality of bus inversion schemes supported by the integrated circuit, and store a count value and a flag type associated with the bus inversion scheme for which the integrated circuit is configured, the count value indicating a number of bits of a data word that must be in a certain logic state for the data word to be inverted, the flag type indicating whether a bit inversion flag for the data word should be set to a logic zero or a logic one to indicate if the data word is inverted, wherein the flag type for a first one of the plurality of bus inversion schemes indicates the bit inversion flag should be set to a logic zero to indicate the data word is inverted and the flag type for a second one of the plurality of bus inversion schemes indicates the bit inversion flag should be set to a logic one to indicate the data word is inverted so that the integrated circuit accommodates bus inversion schemes having different count values and different flag types;
 a first component operable to determine whether to invert data written to the integrated circuit based on a comparison of the flag type associated with the bus inversion scheme for which the integrated circuit is configured and a flag input provided with the data written to the integrated circuit; and
 a second component operable to determine whether to invert data read from the integrated circuit based on the count value and the flag type associated with the bus inversion scheme for which the integrated circuit is configured.

16. The integrated circuit of claim 15, wherein the logic comprises one or more register bits or latches operable to store the count value and the flag type associated with the bus inversion scheme for which the integrated circuit is configured.

17. A system comprising a memory device configured to:
implement one of a plurality of bus inversion schemes supported by the memory device,
store a count value and a flag type associated with the bus inversion scheme for which the memory device is configured, the count value indicating a number of bits of a data word that must be in a certain logic state for the data word to be inverted, the flag type indicating whether a bit inversion flag for the data word should be set to a logic zero or a logic one to indicate if the data word is inverted, wherein the flag type for a first one of the plurality of bus inversion schemes indicates the bit inversion flag should be set to a logic zero to indicate the data word is inverted and the flag type for a second one of the plurality of bus inversion schemes indicates the bit inversion flag should be set to a logic one to indicate the data word is inverted so that the memory device accommodates bus inversion schemes having different count values and different flag types; and
process data written to and read from the memory device in accordance with the count value and the flag type associated with the bus inversion scheme for which the memory device is configured.

* * * * *